US005781717A

United States Patent [19]
Wu et al.

[11] Patent Number: 5,781,717
[45] Date of Patent: Jul. 14, 1998

[54] DYNAMIC SPARE COLUMN REPLACEMENT MEMORY SYSTEM

[75] Inventors: Chun-Chu Archie Wu, Mountain View; Chun Chiu Daniel Wong, Palo Alto, both of Calif.

[73] Assignee: I-Cube, Inc., Campbell, Calif.

[21] Appl. No.: 710,571

[22] Filed: Sep. 19, 1996

[51] Int. Cl.$^6$ .................................................. G06F 11/20
[52] U.S. Cl. ................................. 395/182.06; 371/103
[58] Field of Search ..................... 395/182.03, 182.04, 395/182.05, 182.06, 183.18; 371/10.2, 10.3, 21.6; 365/200, 201

[56] References Cited

U.S. PATENT DOCUMENTS

| | | | |
|---|---|---|---|
| 4,051,354 | 9/1977 | Choate | 371/10.3 |
| 4,389,715 | 6/1983 | Eaton, Jr. et al. | 371/10.3 |
| 4,566,081 | 1/1986 | Ochii | 371/10.3 |
| 4,837,747 | 6/1989 | Dosaka et al. | 371/10.3 |
| 5,179,536 | 1/1993 | Kasa et al. | 365/200 |
| 5,243,570 | 9/1993 | Saruwatari | 365/201 |
| 5,253,354 | 10/1993 | MacDonald et al. | 371/10.2 |
| 5,303,192 | 4/1994 | Baba | 371/10.2 |
| 5,321,697 | 6/1994 | Fromm et al. | 371/10.3 |
| 5,392,246 | 2/1995 | Aiyama et al. | 371/10.3 |
| 5,406,565 | 4/1995 | MacDonald | 371/10.3 |
| 5,475,648 | 12/1995 | Fujiwara | 371/10.3 |
| 5,487,039 | 1/1996 | Sukegawa | 371/10.3 |

*Primary Examiner*—Hoa T. Nguyen
*Assistant Examiner*—Joseph E. Palys
*Attorney, Agent, or Firm*—Smith-Hill and Bedell

[57] ABSTRACT

An MxN dynamic spare column replacement memory system for storing M N-bit data words includes a random access memory (RAM) formed by a rectangular array of M rows and N+S columns of single-bit memory cells. Each row has a unique address and stores an N-bit word using a selected set of N of its N+S cells. An N-line parallel data bus provides data access to the DRAM. Responding to a switching instruction from a switch controller at the start of each memory access cycle, a crossbar switch selectively connects each of the N lines of the data bus to a separate one of the N+S columns. Thus during a memory read or write access cycle the N data lines access N cells of an addressed row columns. The remaining S cells of the row are unused. A host computer occasionally checks the DRAM for defective memory cells, and upon finding a defective cell or cells in any row, the host stores the row address and a switching instruction in the switch controller. At the beginning of each memory access cycle, the switch controller compares the DRAM address to its stored list of addresses of rows having a defective cell. If the current DRAM address matches a stored address, the switch controller switches data bus lines from columns containing the defective cell to spare columns in accordance with a switching instruction stored with the address. Thus spare cells are assigned for replacement of defective cells on an address-by-address basis.

12 Claims, 4 Drawing Sheets

DYNAMIC SPARE COLUMN REPLACEMENT MEMORY SYSTEM

BACKGROUND OF THE INVENTION

1. Field of the Invention

The present invention relates to a system for dynamically replacing damaged cells of a random access memory when they are addressed.

2. Description of Related Art

In orbiting satellites and in other high radiation environments, memory cells within a dynamic random access memory (RAM) are subject to damage when struck by high energy particles. One solution to this problem has been to use memories such as, for example, Silicon Sapphier Insulator (SSI) static random access memories (SRAMs), that are less subject to radiation damage than DRAMs. However SRAMs are more expensive to manufacture require four to five times as much integrated circuit surface area.

A second solution to the DRAM radiation damage problem has been to use redundant memory cells at each storage location so that a bit written to a particular address is actually written concurrently to several memory cells. When reading the bit stored at that address, each memory cell "votes" for the logic state of its stored bit. The state receiving the most votes is taken to be the correct state of the bit. Thus, for example if each storage location has five memory cells, the memory would operate correctly if no more than two of the five cells were damaged. The vote counting process may be software or hardware implemented. While this solution improves DRAM reliability, it substantially increases hardware and/or software overhead.

Spare column replacement is a third solution to the radiation damage problem. Normally an M-word, N-bit DRAM is an array of M rows and N columns of memory cells. Each row has a unique address and stores an N-bit word with each bit of the word being stored in a separate memory cell along that row. In a spare column replacement system, the DRAM is provided with one or more spare columns of memory cells. Each memory address of the DRAM is tested occasionally to determine if it has a bad cell. When a bad cell is found, the column that contains the cell is replaced by the spare column. To accomplish the replacement, switches disconnect the defective column from a corresponding line of the memory's data input/output bus and connect the spare column to the line place of the defective column. The spare column thus assumes the role of the defective column for all subsequent memory read and write accesses at all memory addresses. One drawback to this system is that it requires an entire spare column for every defective cell encountered. A spare column replacement system having, for example, two spare columns will be unable to replace more than two defective memory cells.

SUMMARY OF THE INVENTION

In accordance with the present invention an MxN dynamic spare column replacement memory system for storing M N-bit data words includes a random access memory (RAM) formed by a rectangular array of M rows and N+S columns of single-bit memory cells. Each row has a unique address and normally stores each bit of an N-bit word in a separate one of the first N of its N+S cells. The remaining S cells of each row are spare cells.

An N-line parallel data bus provides data access to the DRAM during memory read and write access cycles. During each memory access cycle, a crossbar switch connects each of the N lines of the data bus to a selected subset of N of the N+S cells of the currently addressed row. Normally the crossbar switch connects each line of the data bus to a corresponding one of the first N cells of the row. However if any one of first N cells of the currently addressed row is defective, the switch connects the data line to one of the S spare cells.

A host computer checks the DRAM for defective memory cells on system startup and occasionally thereafter. Upon finding a defective cell in any row, the host transmits the row's address along with a corresponding switching instruction to a crossbar switch controller, which stores the address and instruction. Thereafter, during each memory access cycle, the switch controller compares the current DRAM address to its stored addresses. If the currently addressed row does not match one of its stored addresses, the switch controller assumes the row has no defective cells and sends a switching instruction to the crossbar switch telling it to connect the data lines to the first N cells of the addressed row. However if the currently addressed row matches one of its stored addresses, the currently addressed row has a defective cell. In such case the switch controller transmits a stored switching instruction to the crossbar switch telling it to connect one of the N data lines to a spare cell instead of to the defective cell. Thus a bit is written to or read out of the spare cell instead of the defective cell.

It is accordingly an object of the invention to provide a memory system that detects and replaces memory cells as they become defective using spare cells in an efficient manner.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
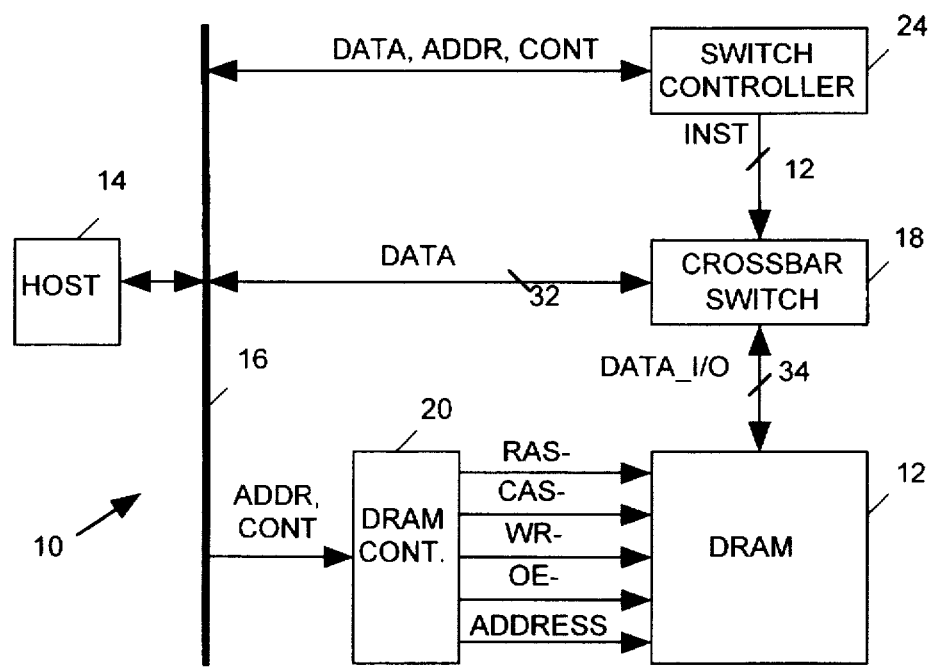
FIG. 1 depicts in block diagram form a memory system with dynamic spare column replacement in accordance with the present invention.

FIG. 1 illustrates in block diagram form a dynamic spare column replacement system 10 in accordance with the present invention. Memory system 10 includes a 256K×34-bit DRAM 12 having 256K rows and 34 columns of 1-bit memory cells. Each row of cells has a unique address and stores a separate one of the 256K 32-bit data words. Normally only the first 32 1-bit memory cells within each row store the row's 32-bit data word. The last two cells of each row are spares, available as replacements when one or two of the first 32 cells become damaged, for example by radiation. Thus the last two columns of memory cells within DRAM 12 are "spare" columns. In accordance with the invention, memory system 10 determines when a memory cell in any row becomes defective and thereafter reconfigures data access to DRAM 12 so as to functionally replace the defective cell with one of the row's spare cells whenever the row is read or write accessed.

A host computer 14 read and write accesses DRAM 12 via a conventional computer bus 16. Bus 16 includes an address bus (ADDR) and a control bus (CONT) through which host computer 14 sends address and control signals to a conventional DRAM controller 20. Bus 16 also includes a 32-bit parallel data bus (DATA) connected to DRAM 12 through a crossbar switch 18. To read data stored at a particular DRAM 12 address, host computer 14 places an address word on the ADDR bus and signals DRAM controller 20 via the CONT bus. In response, DRAM controller 20 transmits various signals (WR-, OE-, RAS-, CAS- and ADDRESS) to DRAM 12 telling it to read out all 34 bits stored in each of the 34 cells of the addressed row. DRAM 12 places the 34-bit data word on 34 lines (DATA-I/O) leading to crossbar switch 18. The crossbar switch 18 selectively routes 32 of the 34 bits appearing on the DATA__I/O lines to the DATA lines of bus 16 for delivery to host computer 14.

When host computer 14 initiates a memory write operation, it places a 32-bit data word on the DATA lines of bus 16, places an address word on the ADDR lines, and signals DRAM controller 20 via the CONT lines to commence a write operation. DRAM controller 20 then tells DRAM 12 via the RAS-, CAS-, WR-, OE- and ADDRESS signals to store data appearing on the DATA__I/O lines from crossbar switch 18 in the row referenced by an address on the ADDR bus.

Crossbar switch 18 selectively routes the 32-bit data word appearing on the DATA lines to 32 of the 34 DATA__I/O lines leading to DRAM 12 so that DRAM 12 stores the data word from the host computer 14. The manner in which crossbar switch 18 interconnects the DATA lines to the DATA-I/O lines determines which 32 of the 34 memory cells of the addressed DRAM row actually receive and store the 32 bits appearing on the DATA lines. During a memory read or write cycle, crossbar switch 18 normally connects the first 32 of the 34 lines of the DATA I/O lines of DRAM 12 to the 32 lines of the DATA bus. Thus the 32 bit data words are normally written to and read from the first 32 cells of each DRAM row. However when host computer 14 read or write accesses a DRAM 12 address known to have a defective memory cell, crossbar switch 18 disconnects the DATA line normally connected to the DATA__I/O line servicing the defective cell and reconnects that DATA line to one of the two spare cells of the currently addressed row. Thus one of the spare cells in the currently addressed row assumes the function of the defective cell.

A switch controller 24 monitors the CONT lines of bus 16 to determine when host computer 14 is read or write accessing DRAM 12. Switch controller 24 stores a list of DRAM 12 addresses containing defective memory cells. Controller 24 also stores along with each address a switching instruction indicating how crossbar switch 18 is to connect the DATA__I/O lines to the DATA lines when that address is read or write accessed. When switch controller 24 detects from the CONT signals on bus 16 that a memory read or write access has begun, it compares the current memory access address on the ADDR lines of bus 16 to its list of addresses having defective cells. If the current address is not on the list, the currently addressed DRAM row has no defective cells. In such case switch controller 24 sends an instruction (INST) to switch 18 telling switch 18 to connect the 32 DATA lines to the first 32 the DATA__I/O lines. Switch 18 operates early in the memory access cycle before DRAM 12 operates. Thereafter, later in the memory access cycle, after DRAM 12 has had time to receive control signals from DRAM controller 20 and carry out its read or write operation, the DATA lines access the first 32 memory cells of the currently addressed row within DRAM 12. Thus the word on the DATA lines is written to or read from the first 32 cells of the addressed row.

On the other hand, switch controller 24 may determine from its internal address list that the currently addressed row in DRAM 12 has a defective memory cell. In that case, switch controller 24 sends an instruction to crossbar switch 18 telling it to connect one of the DATA lines normally connected to the DATA__I/O lines leading to the defective cell to a DATA__I/O lines leading to one of the spare cells. Thereafter, during the latter portion of the memory access cycle, the host computer 14 read or write accesses the spare cells instead of the defective cell.

Host computer 14 determines which memory cells are defective and maintains the list of defective DRAM addresses and instructions stored within switch controller 24. On system start-up and occasionally thereafter, host computer 14 tests every address in DRAM 12 to determine if any cells of the DRAM are defective. When it finds a row containing a defective cell, host computer 14 writes the address and an appropriate switching instruction into switch controller 24. As described in detail below switch controller 24 includes a set of addressable registers for holding addresses and instructions, and host computer 14 read and write accesses those registers via bus 16.

Figure 2:
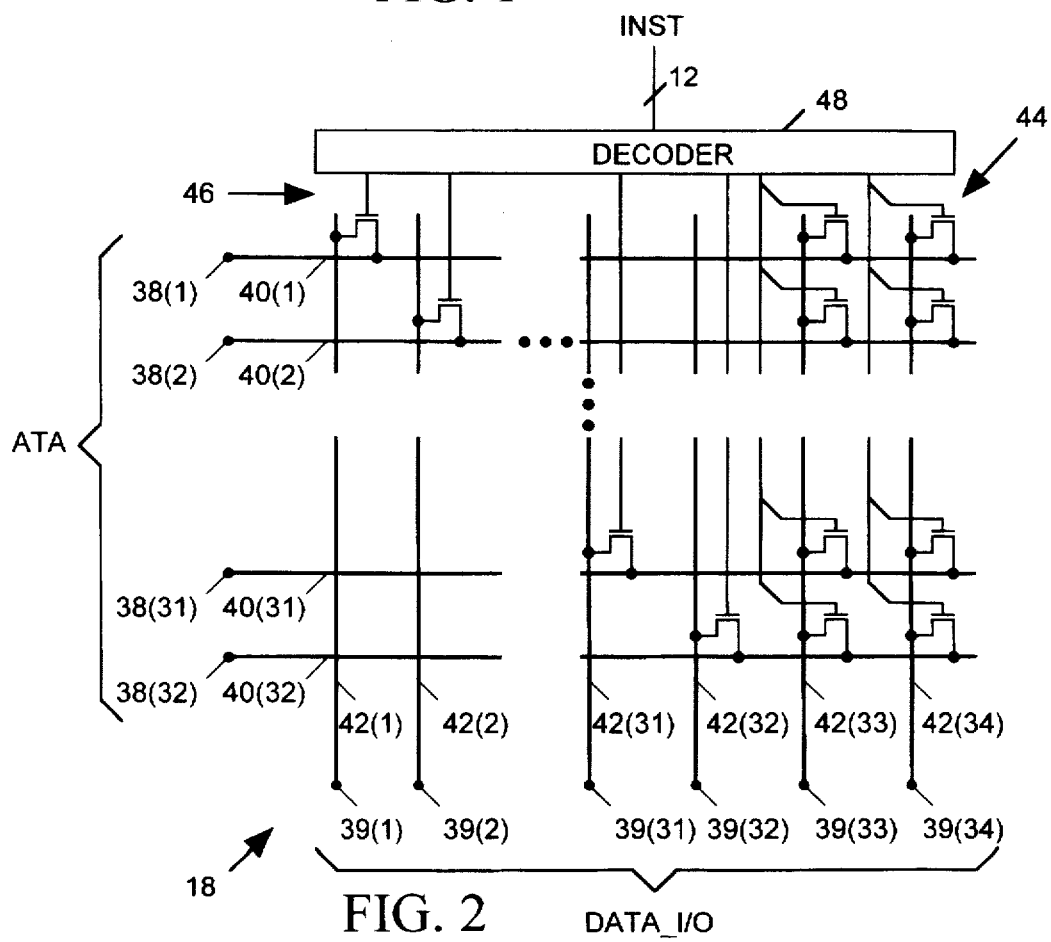
FIG. 2 depicts the crossbar switch of FIG. 1 in more detailed block and schematic diagram form.

FIG. 2 is a block diagram illustrating crossbar switch 18 of FIG. 1 in more detail. Switch 18 includes a set of 32 ports 38(1)–38(32) for receiving the 32 DATA lines of bus 16 of FIG. 1 and another set of 34 ports 39(1)–39(34) for receiving the 34 DATA__I/O lines of FIG. 1, a set of 32 horizontal conductors 40(1)–40(32), each connected to a corresponding one ports 38(1)–38(32) and a set of 34 vertical conductors 42(1)–42(34), each connected to a separate one port 39(1) –39(34). A set of pass transistors 44, under control of output signals 46 produced by a decoder 48, selectively interconnect the horizontal and vertical conductors so as to provide signal paths therebetween. Three pass transistors 44 are provided for each horizontal line 40(I), where I is any member of the set {1 . . . 32}. For any value of I, the three pass transistors 44 selectively link horizontal line 40(I) to one of vertical lines 42(I), 42(33) and 42(34).

During a memory read or write access cycle, decoder 48 receives a 12-bit instruction INST from switch controller 24 of FIG. 1. The first bit of the INST instruction indicates whether the first spare memory cell of a currently addressed row is to replace one of the first 32 cells during the current memory access cycle. Bits 2–6 of the instruction (INST) indicate which of the first 32 cells the first spare cell is to replace. Similarly, bit 7 of instruction INST indicates whether the second spare memory cell of the addressed row is to replace one of the first 32 cells, and bits 8–12 indicate which of the first 32 cells the second spare cell is to replace. Decoder 48 decodes instruction INST and asserts a control signal at the gate of one pass transistor 44 for each horizontal conductor 40(I) so as to connect the 32 DATA lines to a selected subset of 32 of the 34 DATA__I/O lines as determined by instruction INST.

Figure 3:
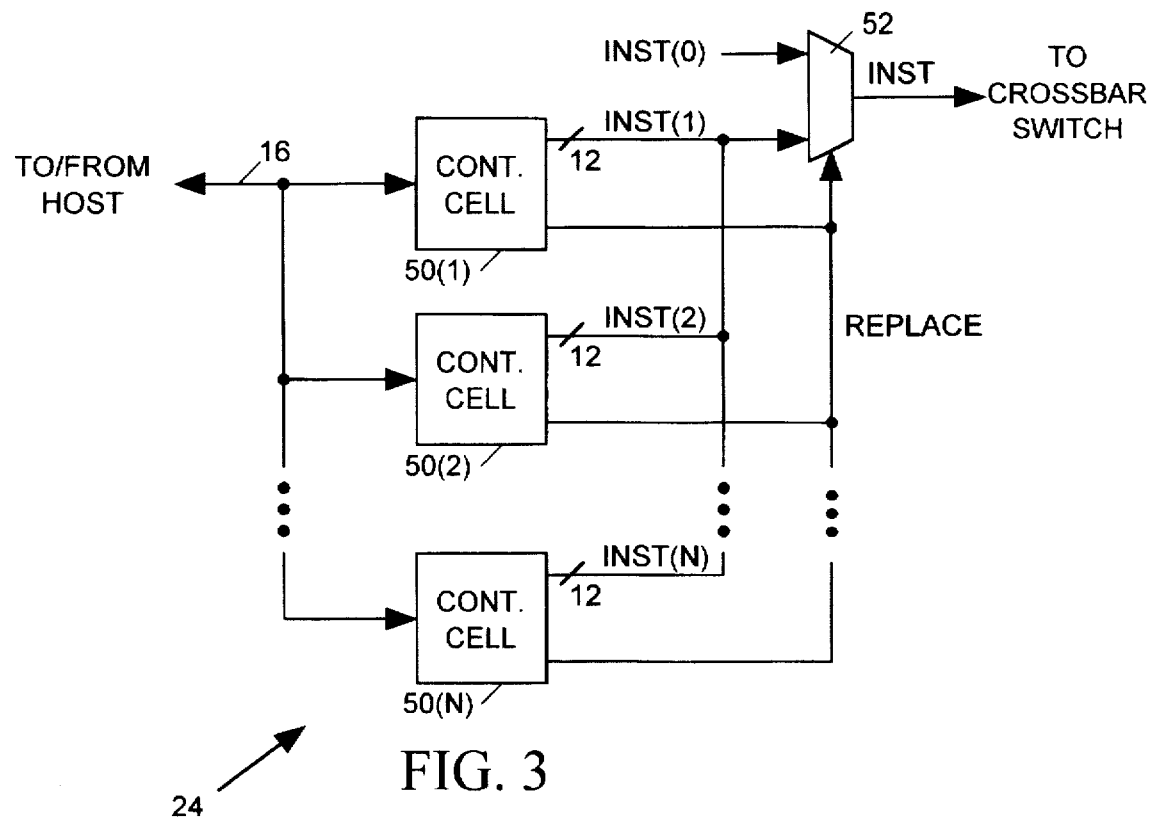
FIG. 3 depicts the switch controller of FIG. 1 in more detailed block diagram form.

FIG. 3 illustrates switch controller 24 of FIG. 1 in more detailed block diagram form. Controller 24 includes a set of N table cells 50(1) ... 50(N) where N may be any number up to 256. Each cell 50 is capable of storing a DRAM address and a 12-bit switching instruction. Host computer 14 of FIG. 1 may separately access each table cell 50(I) via computer bus 16 so as to read/modify/write the address and instruction pair stored therein. Each table cell 50(I) separately monitors the address appearing on the ADDR lines. If the address on the ADDR lines matches the address stored in any table cell 50(I), that cell sends its 12-bit stored instruction INST(I) to a multiplexer 52 and asserts a REPLACE signal. The REPLACE signal tells multiplexer 52 to forward the instruction INST(I) as switching instruction INST to crossbar switch 18 of FIG. 1. This instruction configures the switch to replace one or two defective cells at the current address with spare cell(s).

If the current DRAM address on the ADDR lines does not match an address stored in any table cell 50(I), then none of cells 50(I) asserts the REPLACE signal. In that case, multiplexer 52 forwards a 12-bit hard-wired instruction INST(0) to switch 12. The INST(0) instruction tells switch 18 to connect the DATA lines to the first 32 DATA_I/O lines of FIG. 1 in the normal manner, since none of the first 32 cells of the addressed DRAM row are known to be defective.

Figure 4:
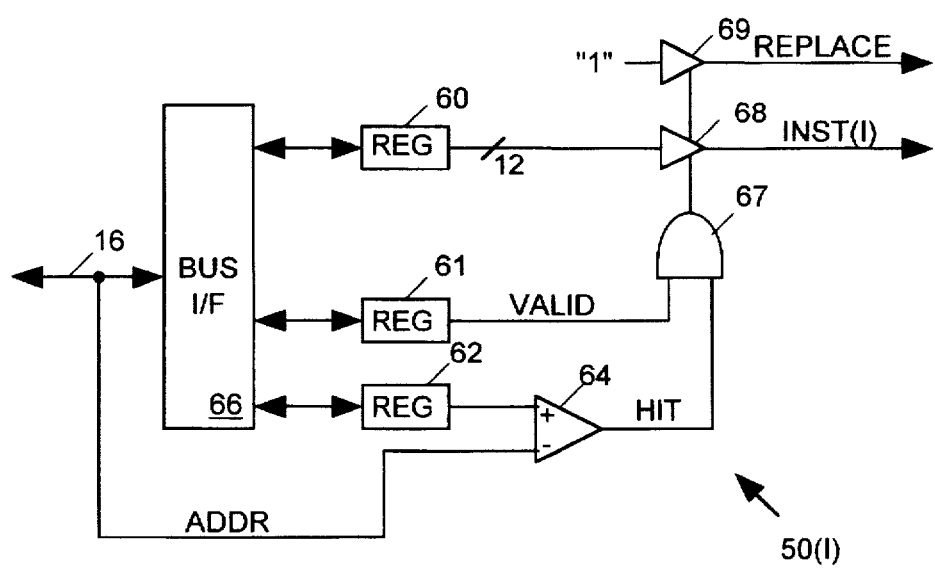
FIG. 4 depicts a typical controller cell of FIG. 3 in more detailed block diagram form.

FIG. 4 illustrates a typical table cell 50(I) of FIG. 1. Cells 50(1) ... 50(N) are all similar. Cell 50(I) includes a set of three registers 60, 61 and 62. Register 60 stores the 12 bit instruction and register 62 stores an address. Register 61 stores a single bit VALID indicating whether the address in register 62 is valid. A conventional bus interface circuit 66 provides host computer 14 of FIG. 1 read and write access to registers 60–62 via computer bus 16. A comparator 64 compares the address currently on the ADDR lines to the address stored in register 62. If the two addresses match, comparator 64 asserts an output signal HIT supplied to an input of an AND gate 67. The VALID bit stored in register 61 drives a second input of AND gate 66. If the HIT and VALID bits are both true, AND gate 66 turns on tri-state buffers 68 and 69. When turned on, buffer 68 forwards the instruction INST(I) stored in register 60 to multiplexer 52 of FIG. 3, and buffer 69 asserts the REPLACE signal supplied to the control input of multiplexer 52 of FIG. 3.

Figure 5:
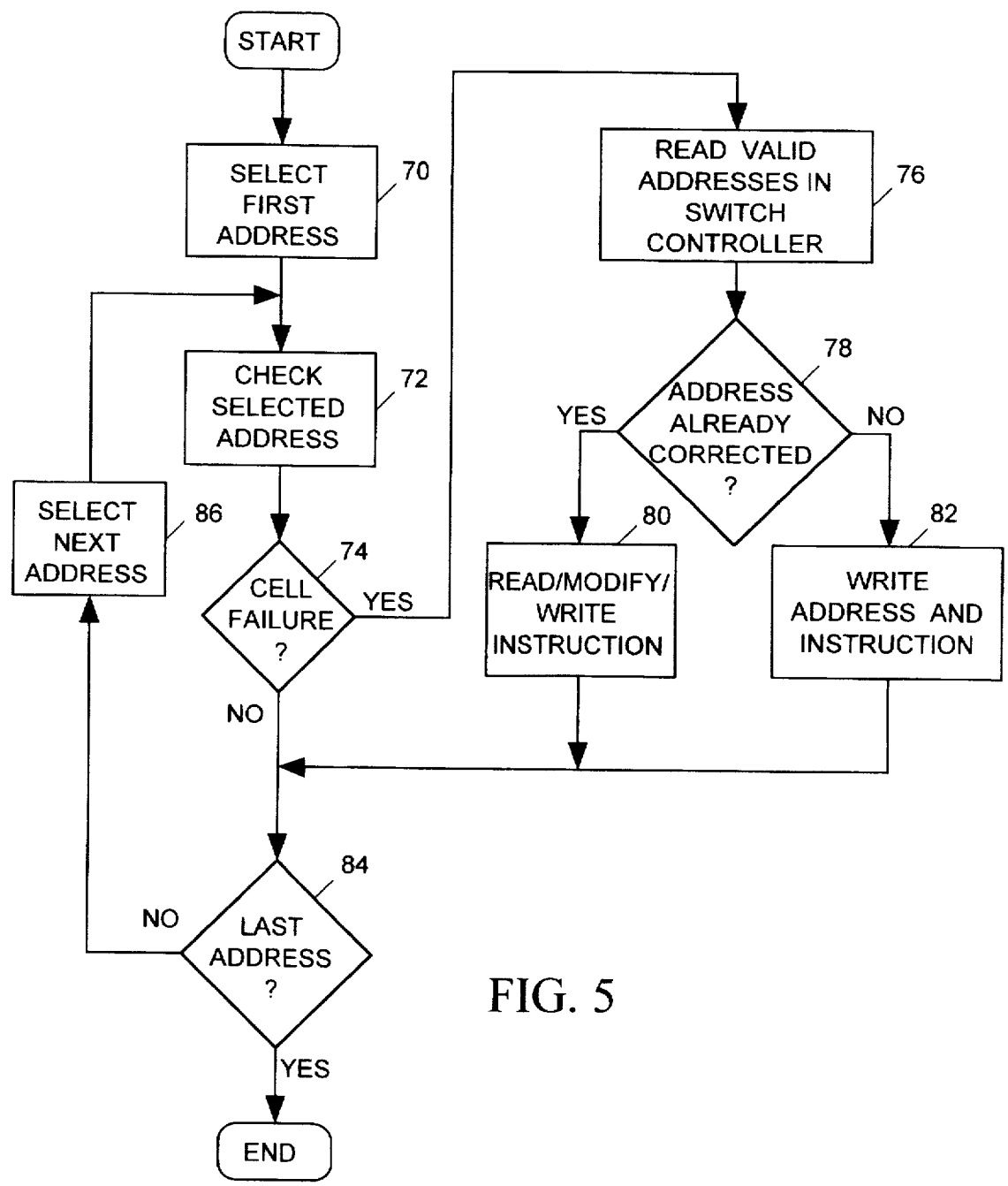
FIG. 5 is a flow chart illustrating operations carried out by the host computer of FIG.

FIG. 5 is a flow chart illustrating a program carried out by host computer 14 of FIG. 1 when checking DRAM 12 for defective cells and updating the address/instruction data in switch controller 24 of FIG. 1. Host computer 14 suitably executes the program on system startup and periodically thereafter. Referring to FIG. 5, the host computer selects the first DRAM address (step 70) and then checks the memory cells of the selected address (step 72) to determine if any cells are defective. The host computer checks the memory cells by first writing a word having a logical "0" in each bit position to the selected address and then reading the word back out of the selected address to determine if a "0" still appears at each bit position. The host computer then writes a word having a logical "1" to the selected address and reads the word back to determine if a logical "1" still appears in each bit position. If the host computer detects an inappropriate bit any bit position of a read out word, it knows the cell servicing that bit position is defective. If a cell is defective (step 74), host computer 14 reads addresses and VALID bits stored in each table cell 50(1)–50(N) of the switch controller 24 of FIG. 3 to determine if one of the spare cells is already being used at that address (step 78). If one of the spare cells is already being used, the host computer modifies the instruction and stores it back in that table cell (step 80). The modified instruction directs the crossbar switch to use both spare cells as replacements for two of the first 32 cells, or may direct the crossbar switch to use the second spare in place of the first spare in the rare case in which the first spare cell has become defective. If the host computer does not find the address in one of the table cells 50(I) of FIG. 3 at step 78, the host computer writes the address and an appropriate instruction to a previously unused table cell of the switch controller (step 82). Once the new or modified instruction is written to the switch controller at steps 80 or 82, or after the host determines at step 74 that none of the cells at the current address are defective, the host computer determines whether the last DRAM address has been tested (step 84). If not, the host selects a next DRAM address (step 86) and repeats the process of checking that address for defective cells and updating the switch controller data as necessary (steps 72–82). When the last DRAM address has been tested (step 84) the program ends.

Figure 6:
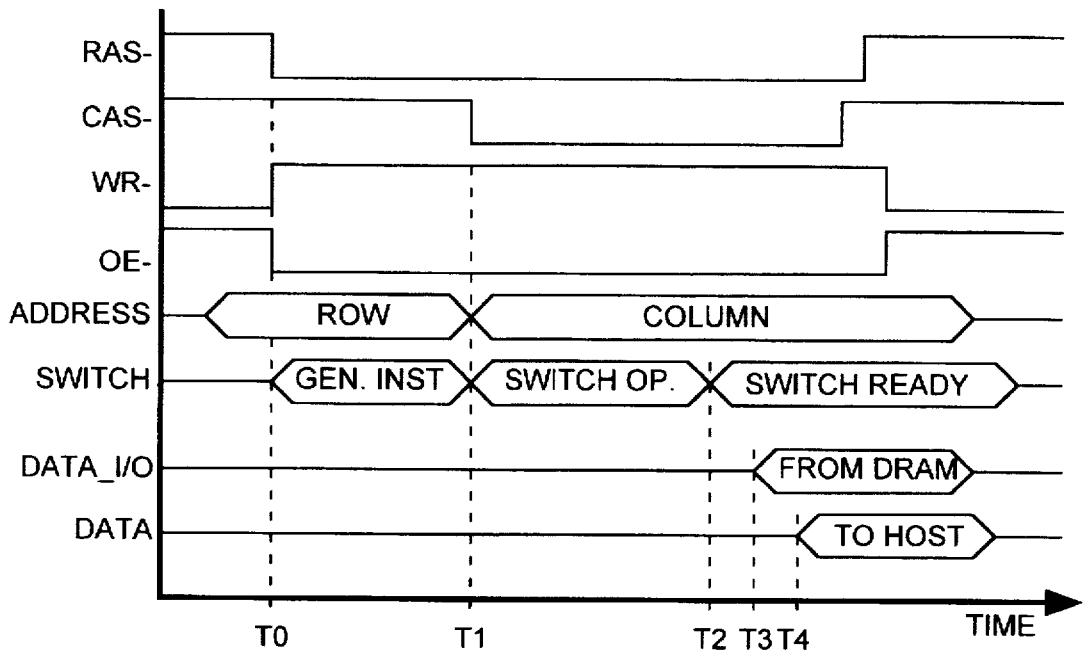
FIG. 6 is a timing diagram illustrating a read cycle of the memory system of FIG. 1.

FIG. 6 is a diagram illustrating timing of system operation during a memory read access. Referring to FIGS. 1 and 6, when DRAM controller 20 receives a DRAM address on the ADDR bus along with control signals indicating a memory read cycle, controller 20 breaks the bus address into two parts, a "row address" and a "column address". Controller 20 initially (at time T0) places the row address on a set of ADDRESS lines leading to DRAM 12, drives and output enable signal (OE-) low and a write enable strobe signal (WR-) input to DRAM 12 high to indicate that a memory read cycle is in progress. Controller 20 also drives a row address strobe signal (RAS-) low to tell DRAM 12 that the row address is available. DRAM 12 then begins decoding the row address. Thereafter, at time T1 controller 20 places the column address on the ADDRESS lines and drives a column address strobe signal (CAS-) low. DRAM 12 responds to the CAS- signal by decoding the column address and then (time T3) sending the data stored at the currently addressed memory location to crossbar switch 18 via the DATA_I/O lines. Currently, for typical prior art DRAMs, the period between times T0 and T3 is 40–70 ns.

While DRAM controller 20 is busy transmitting the row and column addresses to DRAM 12, switch controller 24 configures crossbar switch 18 to appropriately route 32 of the 34 data bits to be read out of DRAM 12 to the DATA lines of bus 16. Switch controller 24, within 15 ns of detecting the start of a memory access cycle switch controller 24, generates a switching instruction (INST) to appropriately configure crossbar switch 18 for the current DRAM address (time T1). Crossbar switch 18 receives the instruction at time T1 and by time T2 has created paths between the DATA and DATA_I/O lines in accordance with the instruction. Thus by the time DRAM 12 reads out its addressed data at time T3, crossbar switch 18 is ready to route it to the DATA lines. The data then passes through the crossbar switch and appears on the DATA lines by time T4. The small delay (less than 10 ns) between times T3 and T4 represents the transit time of the signal through crossbar switch 18 and is the only memory access time overhead of the dynamic column replacement feature of the memory system.

Figure 7:
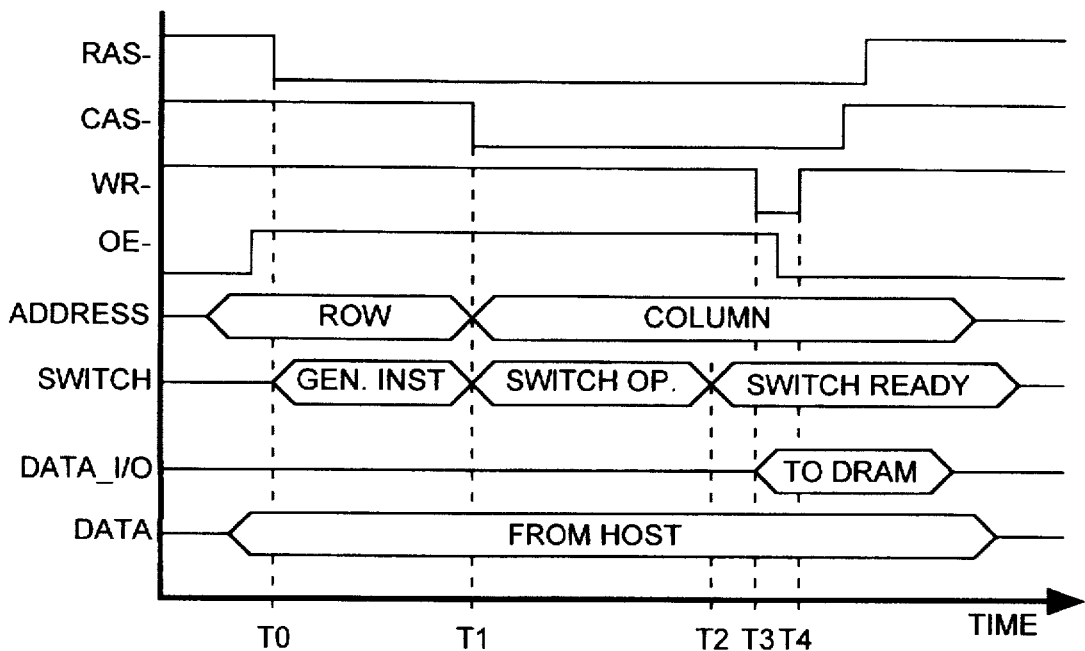
FIG. 7 is a timing diagram illustrating a write cycle of the memory system of FIG. 1.

FIG. 7 is a diagram illustrating timing of system operation during a memory write access. Referring to FIGS. 1 and 7, when DRAM controller 20 receives a DRAM address on the ADDR bus along with control signals indicating a memory write cycle, controller 20 drives the OE- signal high to indicate data is to flow into DRAM 12, places the row address portion of the DRAM address on the ADDRESS lines and then drives the RAS- strobe low (time T0). DRAM 12 then begins decoding the row address. Thereafter, at time T1 controller 20 places the column address on the ADDRESS lines and drives the CAS- signal low. DRAM 12 then decodes the column address. Controller 20 then sends a negative-going WR-signal pulse (times T3–T4) to DRAM 12. On the leading edge of the WR- pulse (time T3) DRAM 12 stores the data appearing on its DATA_I/O input at its currently addressed memory location. Currently, for typical prior art DRAMs, the period between times T0 and T4 is 40–70 ns.

While DRAM controller 20 is transmitting the row and column addresses to DRAM 12, switch controller 24 configures crossbar switch 18 to appropriately interconnect the DATA and DATA_I/O lines for the current memory address. At time T0, switch controller 24 detects the start of a memory access cycle and by time T1, less than 15 ns later, has generated an appropriate switching instruction (INST). Crossbar switch 18 receives the instruction at time T1 and at time T2, within 15 ns after T1, has established the indicated paths between the DATA and DATA_I/O lines. The data from the host then passes through switch 18 and arrives at DRAM 12 via the DATA_I/O lines at time T3 when the DRAM is ready to store the data. Given that the time the system requires to appropriately set up and route the data through the crossbar switch 18 is 40 ns or less, and the pulse width (T3–T4) of the WR- signal is 10 ns, then the dynamic spare column replacement system does not degrade performance of DRAMs having write cycle speeds (elapsed time T0–T4) of 50 ns or more.

While the forgoing specification has described preferred embodiment(s) of the present invention, one skilled in the art may make many modifications to the preferred embodiment without departing from the invention in its broader aspects. For example while a 256K×32 dynamic spare column replacement memory system having 2 spare columns is described herein above, one skilled in the art will appreciate that the size of the memory system and the number of spare columns is a matter of design choice and can be easily modified.

In the preferred embodiment of the invention switch controller 24 of FIG. 1 stores a separate switching instruction for each DRAM 12 address having a defective memory cell. Thus the particular column of cells replaced by a spare column depends on the current address. For example for DRAM address N, a cell in a spare column may be assigned to replace memory cell 5 of the addressed DRAM row, while for DRAM address N+1 the cell of that same spare column may be assigned to replace memory cell 8 of the addressed DRAM row.

In alternative embodiments of the invention, controller 24 may assign spare column replacement with lower address resolution. For example, where DRAM memory is organized into a set of memory banks, the first few bits of an address may refer to a particular memory bank. In an alternative embodiment of the invention, when a memory cell at some particular address of a memory bank becomes defective, the host computer may store a corrective switching instruction and only the first few bits of the address, the bit refereeing to that bank, in switch controller 24. Thereafter whenever any address in that memory bank is read or write accessed, controller 24 tells switch 18 to use the spare column in place of the defective cell. In this embodiment the spare column replaces all cells of a particular column in that bank even though only one cell of the column may be defective. Thus in the alternative embodiment, spare columns are assigned on a bank-by-bank basis rather than on an address-by-address basis as in the preferred embodiment. The preferred embodiment of the dynamic spare column replacement system provides more efficient use of spare cell resources. But in the preferred embodiment, switch controller 24 must for example, store and process 32-bit address words and therefore requires large registers and comparators. In the preferred embodiment, the switch controller need only store and process the first few bits of a large address and therefore has smaller registers and comparators.

The appended claims therefore are intended to cover all such modifications as fall within the true scope and spirit of the invention.

What is claimed is:

1. A dynamic spare column replacement memory system for storing an input N-bit data word (where N is greater than 0) at an address indicated by an input address word, comprising:

memory means, having a plurality of N+S bit addressable data storage locations (where S is greater than 0), for receiving the input address word and an input N+S bit data word and for storing the input N+S data word in any one of said plurality of storage locations addressed by the address word;

an N+S line data bus for conveying said N+S bit data word to said memory means;

switch means having N first ports, each for receiving a separate bit of said input N-bit data word, and having N+S second ports, each connected to a separate line of said N+S line data bus, and having means for interconnecting each of said first ports to a separate one of said second ports selected in response to an input switch instruction;

switch control means having a plurality of storage cells, each for storing a separate address value and a corresponding switch instruction; and means for receiving said input address word and for transmitting the switch instruction stored in any one storage cell of said storage cells when the input address word matches an address value stored in said storage cell.

2. The memory system in accordance with claim 1 wherein each addressable data storage location of said memory means comprises N+S single bit memory cells, each for storing a separate bit of an N+S bit data word.

3. The memory system in accordance with claim 2 further comprising means for periodically determining when a memory cell of any one of said addressable data storage locations of said memory means becomes defective and for storing a switch instruction and an address value referencing the addressable data storage location having the defective memory cell in one of said storage cells of said switch control means.

4. The memory system in accordance with claim 1 wherein said memory means comprises a dynamic random access memory.

5. The memory system in accordance with claim 1 wherein said means for interconnecting comprises a crossbar switch.

6. A dynamic spare column replacement memory system for storing an input N-bit data word (where N is greater than 0) at an address indicated by an input address word, comprising:

memory means, having a plurality of N+S bit addressable data storage locations (where S is greater than 0), for receiving the input address word and an input N+S bit data word and for storing the input N+S data word in any one of said plurality of storage locations addressed by the address word;

an N+S line data bus for conveying said N+S bit data word to said memory means;

switch means having N first ports, each for receiving a separate bit of said input N-bit data word, and having N+S second ports, each connected to a separate line of said N+S line data bus, and having means for interconnecting each of said first ports to a separate one of said second ports selected in response to an input switch instruction;

switch control means having a plurality of storage cells, each for storing a separate address value and a corresponding first switch instruction;

means for receiving said input address word, for transmitting the switch instruction stored in any one storage cell of said storage cells to said switch means when the input address word matches an address value stored in said storage cell, and for generating and transmitting a second switch instruction to the switch means when the input address word does not match an address value stored in any one of said storage cells.

7. A dynamic spare column replacement memory system for storing an input N-bit data word (where N is greater than 0) at an address indicated by an input address word, comprising:

memory means, having a plurality of N+S bit addressable data storage locations (where S is greater than 0), for receiving the input address word and an input N+S bit data word and for storing the input N+S data word in any one of said plurality of storage locations addressed by the address word;

an N+S line data bus for conveying said N+S bit data word to said memory means;

switch means having N first ports, each for receiving a separate bit of said input N-bit data word, and having N+S second ports, each connected to a separate line of said N+S line data bus, and having means for interconnecting each of said first ports to a separate one of said second ports selected in response to an input switch instruction;

a plurality of storage cells, each for storing a separate address value and a corresponding switch instruction; and means for receiving said input address word and for transmitting the switch instruction stored in any one storage cell of said storage cells when a portion of the input address word matches an address value stored in said storage cell.

8. A dynamic spare column replacement memory system for storing an input N-bit data word (where N is greater than 0) at an address indicated by an input address word, comprising:

memory means, having a plurality of N+S bit addressable data storage locations (where S is greater than 0), for receiving the input address word and an input N+S bit data word and for storing the input N+S data word in any one of said plurality of storage locations addressed by the address word;

an N+S line data bus for conveying said N+S bit data word to said memory means;

switch means having N first sorts, each for receiving a separate bit of said input N-bit data word, and having N+S second ports, each connected to a separate line of said N+S line data bus, and having means for interconnecting each of said first ports to a separate one of said second ports selected in response to an input switch instruction;

switch control means having a plurality of storage cells, each for storing a separate address value and a corresponding first switch instruction;

means for receiving said input address word, for transmitting the switch instruction stored in any one storage cell of said storage cells to said switch means when a portion of the input address word matches an address value stored in said storage cell, and for generating and transmitting a second switch instruction to the switch means when said portion of the input address word does not match an address value stored in any one of said storage cells.

9. The memory system in accordance with claim 8 wherein each addressable data storage location of said memory means comprises N+S single bit memory cells, each for storing a separate bit of an N+S bit data word.

10. The memory system in accordance with claim 9 further comprising means for periodically determining when a memory cell of any one of said addressable data storage locations of said memory means becomes defective and for storing a switch instruction and an address value matching a portion of an address of addressable data storage location having the defective memory cell in one of storage cells of said switch control means.

11. A dynamic column replacement memory system for storing an N-bit data word arriving on a data bus at an address indicated by a value of an input address, the apparatus comprising:

a memory comprising an array of M rows and N+S columns of memory cells, where M is greater than 1, and N and S are each greater than 0, each row of said array corresponding to a separate value of said input address;

switch means for connecting said data bus to a selected subset of N of said N+S columns of memory cells in accordance with an input switching instruction;

memory controller means for receiving said input address and for transmitting control signals to a row of said memory cells corresponding to a value of input address, the control signals telling each cell of the row to store a bit of the data word appearing on any of one said data lines to which the cell may be connected via said switch means; and means for receiving and storing a reference address and a switching instruction, for receiving said input address, for comparing said input address to the stored reference address, and for transmitting said stored instruction to said switch means when the input address matches the stored reference address.

12. The memory system in accordance with claim 11 further comprising means for periodically determining when a cell of said array is defective and for transmitting said reference address and switching instruction to said switch controller for storage therein, wherein the value of the reference address corresponds to a row including the defective cell and wherein the subset of N memory cells selected by said switching instruction does not include the defective cell.

* * * * *